United States Patent [19]

Matloubian et al.

[11] Patent Number: 5,603,765
[45] Date of Patent: Feb. 18, 1997

[54] METHOD OF GROWING HIGH BREAKDOWN VOLTAGE ALLNAS LAYERS IN INP DEVICES BY LOW TEMPERATURE MOLECULAR BEAM EPITAXY

[75] Inventors: Mehran Matloubian, Encino; Linda M. Jelloian, Northridge; Mark Lui, Thousand Oaks; Takyiu Liu, Newbury Park, all of Calif.

[73] Assignee: Hughes Aircraft Company, Los Angeles, Calif.

[21] Appl. No.: 507,744

[22] Filed: Apr. 21, 1995

Related U.S. Application Data

[63] Continuation of Ser. No. 166,396, Dec. 1, 1993, abandoned.
[51] Int. Cl.$^6$ .................................................. H01L 21/20
[52] U.S. Cl. .................... 117/94; 117/103; 117/106; 117/108; 117/953; 437/133
[58] Field of Search .............. 117/94, 103, 106, 117/108, 953; 437/133

[56] References Cited

U.S. PATENT DOCUMENTS

| | | | |
|---|---|---|---|
| 5,023,675 | 6/1991 | Ishikawa . | |
| 5,084,743 | 1/1992 | Mishra et al. . | |
| 5,164,800 | 11/1992 | Nakajima | 257/194 |
| 5,270,798 | 12/1993 | Pao et al. | 257/134 |
| 5,322,808 | 6/1994 | Brown et al. | 437/40 |

OTHER PUBLICATIONS

Korona et al., "Optical and electrical measurements of low-temperature InAlAs," Acta Phys. Pol. A (Poland), vol. 82, No. 5, pp. 825–828, Nov. 1992 (Abstract only).
R. A. Metzger et al., "Growth and characterization of low temperature AlInAs," Journal of Crystal Growth 111 (1991), pp. 445–449.
R. A. Metzger et al., "Control of Be diffusion in AlInAs/GatnAs heterostructure bipolar transistors through use of low–temperature GaInAs," Journal of Vacuum Science and Technology, B 10(2), Mar./Apr. 1992, pp. 859–862.
Matloubian et al., "High Power and High Efficiency AlInAs/GaInAs on InP HEMTs", IEEE MTT-S Int. Microwave Symp. Dig., 1991, pp. 721–724.
R. Averbeck et al., "Oxide Desorption from InP Under Stabilizing Pressures of $P_2$ or $As_4$", Appl. Phys. Lett. 59(14) 30 Sep. 1991, pp. 1732–1734.
E. Bauer, "Reflection Electron Diffraction", Chapter 15, pp. 501–542, Techniques for the Direct Observation of Structure and Imperfections Part II, Interscience Publishers, 1969.
Georgakilas et al., "A Comprehensive Optimization of InAlAs Molecular Beam Epitaxy for InGaAs/InAlAs HEMT Technology", Journal of the Eectrochemical Society, vol. 140, No. 5, May 1993, pp. 1503–1509.
Korona, et al, "Optical and Electrical Measurements of Low Temperature InAlAs" Acta Phys. Pol. A (Poland), vol. 82, No. 5, pp. 826–828, Nov., 1992 (whole article).

*Primary Examiner*—R. Bruce Breneman
*Assistant Examiner*—Linda J. Fleck
*Attorney, Agent, or Firm*—V. D. Duraiswamy; W. K. Denson-Low

[57] ABSTRACT

High breakdown voltages for AlInAs layers in InP-based devices, such as a gate layer in an InP HEMT or a collector layer in a heterojunction bipolar transistor, are achieved by growing the AlInAs layer by MBE at a substrate temperature about 70°–125° C. below the temperature at which a 2×4 reflective high energy diffraction pattern is observed. This corresponds to a growth temperature range of about 415°–470° C. for a 540° 2×4 reconstruction temperature. Preferred growth temperatures within these ranges are 80° C. below the 2×4 reconstruction temperature, or about 460° C. Higher breakdown voltages are obtained than when the AlInAs layer is grown at either higher or lower temperatures.

20 Claims, 4 Drawing Sheets

| | | | |
|---|---|---|---|
| 100 nm | GaInAs CONTACT | n=1x10$^{19}$cm$^{-3}$ | — 76 |
| 70 nm | AlInAs EMITTER CONTACT | n=1x10$^{19}$ | — 74 |
| 120 nm | AlInAs EMITTER | n=8x10$^{17}$ | — 72 |
| 30nm | AlInAs/GaInAs COMPOSITIONAL GRADE | n=8x10$^{17}$ | — 70 |
| 10 nm | GaInAs SPACER | p=2x10$^{18}$ | — 68 |
| 60 nm | GaInAs BASE | p=2x10$^{19}$ | — 66 |
| 20 nm | GaInAs SPACER | p=5x10$^{17}$ | — 64 |
| 20-50 nm | GaInAs SPACER | n=1x10$^{17}$ | — 62 |
| 100 nm | GaInAs /InP COMPOSITIONAL GRADE | n=1.4-3x10$^{16}$ | — 60 |
| 250 nm | AlInAs LOW TEMP | n=1.4-3x10$^{16}$ | —58 |
| 500-750 nm | InP COLLECTOR | n=1.4-3x10$^{16}$ | —78 |
| 700 nm | GaInAs SUBCOLLECTOR | n=1x10$^{19}$ | — 56 |
| 10nm | GaInAs BUFFER | UNDOPED | —54 |
| | InP SUBSTRATE | | — 52 |

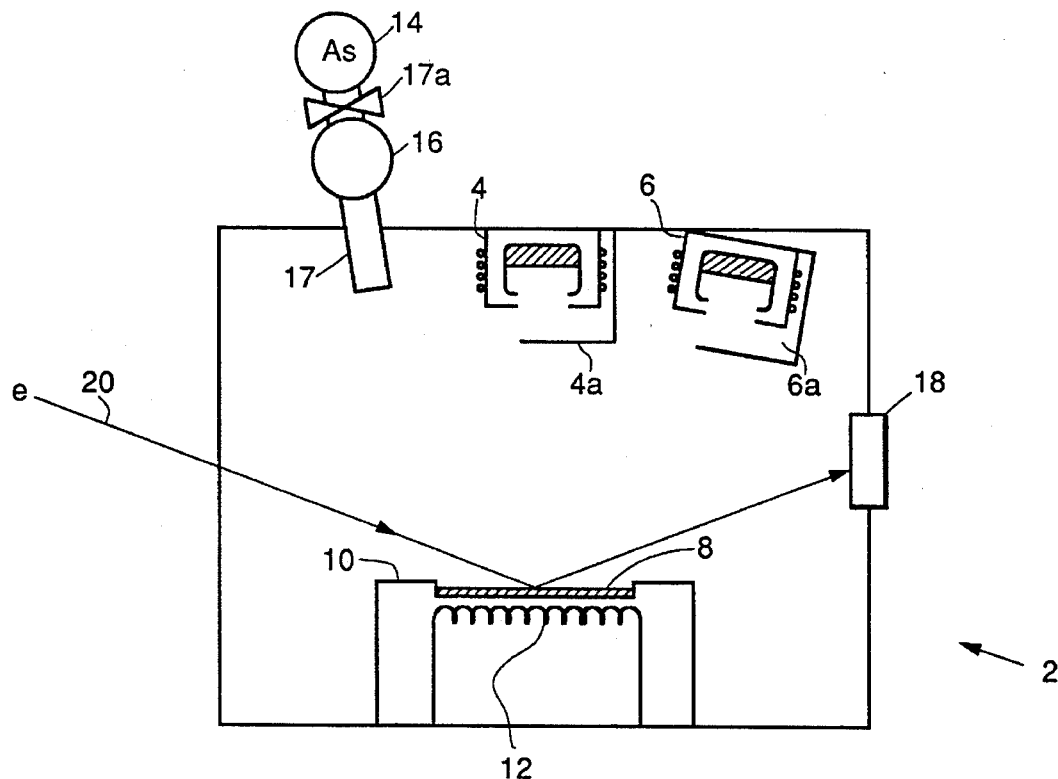
FIG.1.
FIG.2.
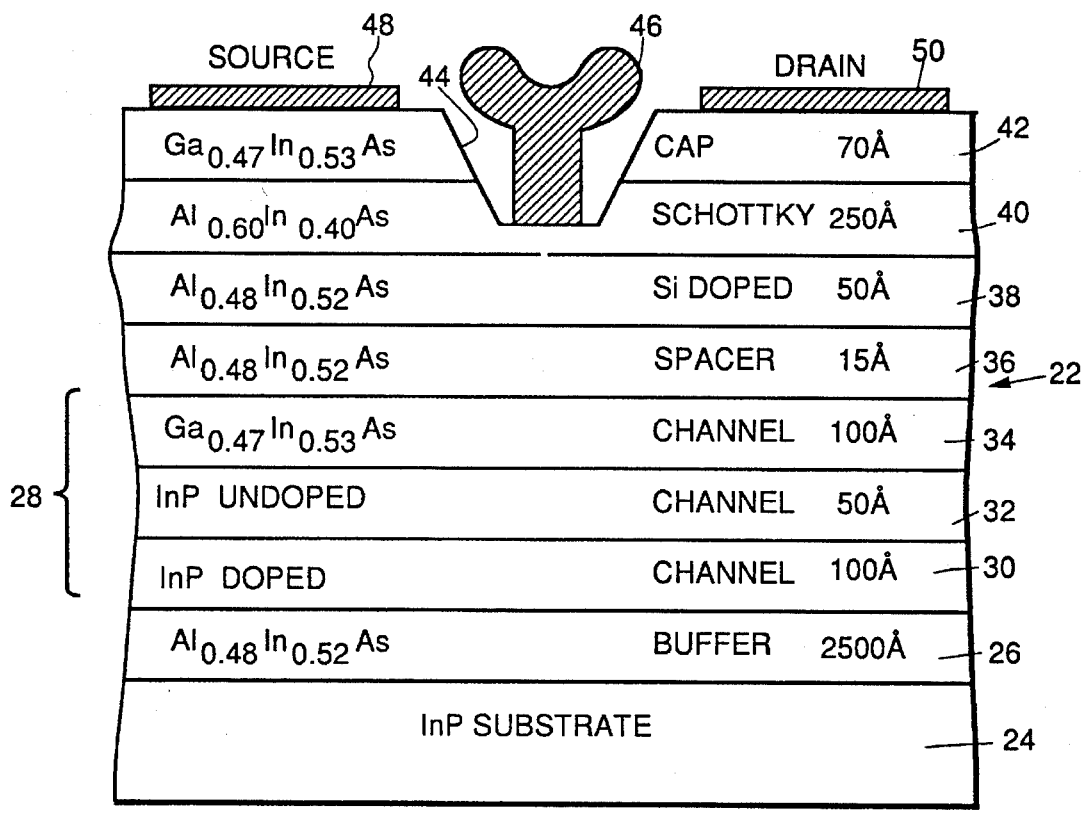

FIG. 6.

| 100 nm | GaInAs CONTACT | n=1x10$^{19}$cm$^{-3}$ | 76 |
| --- | --- | --- | --- |
| 70 nm | AlInAs EMITTER CONTACT | n=1x10$^{19}$ | 74 |
| 120 nm | AlInAs EMITTER | n=8x10$^{17}$ | 72 |
| 30 nm | AlInAs/GaInAs COMPOSITIONAL GRADE | n=8x10$^{17}$ | 70 |
| 10 nm | GaInAs SPACER | p=2x10$^{18}$ | 68 |
| 60 nm | GaInAs BASE | p=2x10$^{19}$ | 66 |
| 20 nm | GaInAs SPACER | p=5x10$^{17}$ | 64 |
| 20-50 nm | GaInAs SPACER | n=1x10$^{17}$ | 62 |
| 100 nm | GaInAs /InP COMPOSITIONAL GRADE | n=1.4-3x10$^{16}$ | 60 |
| 250 nm | AlInAs COLLECTOR | n=1.4-3x10$^{16}$ | 58 |
| 700 nm | GaInAs SUBCOLLECTOR | n=1x10$^{19}$ | 56 |
| 10 nm | GaInAs BUFFER | UNDOPED | 54 |
| | InP SUBSTRATE | | 52 |

FIG. 7.

| 100 nm | GaInAs CONTACT | n=1×10$^{19}$cm$^{-3}$ | 76 |
| --- | --- | --- | --- |
| 70 nm | AlInAs EMITTER CONTACT | n=1×10$^{19}$ | 74 |
| 120 nm | AlInAs EMITTER | n=8×10$^{17}$ | 72 |
| 30 nm | AlInAs/GaInAs COMPOSITIONAL GRADE | n=8×10$^{17}$ | 70 |
| 10 nm | GaInAs SPACER | p=2×10$^{18}$ | 68 |
| 60 nm | GaInAs BASE | p=2×10$^{19}$ | 66 |
| 20 nm | GaInAs SPACER | p=5×10$^{17}$ | 64 |
| 20-50 nm | GaInAs SPACER | n=1×10$^{17}$ | 62 |
| 100 nm | GaInAs /InP COMPOSITIONAL GRADE | n=1.4-3×10$^{16}$ | 60 |
| 250 nm | AlInAs LOW TEMP | n=1.4-3×10$^{16}$ | 58 |
| 500-750 nm | InP COLLECTOR | n=1.4-3×10$^{16}$ | 78 |
| 700 nm | GaInAs SUBCOLLECTOR | n=1×10$^{19}$ | 56 |
| 10 nm | GaInAs BUFFER | UNDOPED | 54 |
| | InP SUBSTRATE | | 52 | ns
METHOD OF GROWING HIGH BREAKDOWN VOLTAGE ALLNAS LAYERS IN INP DEVICES BY LOW TEMPERATURE MOLECULAR BEAM EPITAXY

This is a continuation application Ser. No. 08/166,396, filed Dec. 1, 1993 now abandoned.

BACKGROUND OF THE INVENTION

1. Field of the Invention

This invention relates to methods for growing aluminum-indium-arsenide (AlInAs) layers on indium phosphide (InP)-based devices, and more particularly to growing the AlInAs layer so that it has a high breakdown voltage.

2. Description of the Related Art

Several InP-based devices have been generated in which a significant electric field is developed through an AlInAs layer incorporated into the device. Because of the relatively high fields involved, it is important that the AlInAs layer have a high breakdown voltage. For example, one of the major limitations of InP-based high electron mobility transistors (HEMTs) for power applications has been the gate-to-drain breakdown voltage, which is impressed mostly across an AlInAs layer. The AlInAs layer is referred to as a Schottky layer because it is contacted by a metal gate contact, forming a Schottky junction with a non-linear voltage-current characteristic. InP-based power HEMTs with a gate length of 0.25 microns typically have a breakdown voltage of 7 volts at a current density of 600 mA/mm, with the highest reported breakdown voltage for these parameters being approximately 10 volts (see Matloubian et al., "High power and high efficiency AlInAs/GaInAs on InP HEMTs", *IEEE MTT-S Int Microwave Symp. Dig.*, 1991, pages 721–724). The gate-to-drain breakdown voltage generally increases as the gate length is enlarged and/or the current density is reduced. The relatively low breakdown voltages that have been achieved so far limit the operating voltage of a power HEMT for reliable operation to about 5 volts. Higher power densities and power-added efficiencies could be achieved by increasing the transistor's operating voltage, but this would risk a voltage breakdown.

Electronic devices which employ AlInAs layers are commonly grown by molecular beam epitaxy (MBE). The substrate temperature within the MBE chamber must be controlled, since the ultimate device characteristics will change with different growth temperatures. The absolute InP substrate temperature within the chamber is difficult to measure directly, since the substrate is rotated during the growth cycle. Instead, temperature measurements are commonly made indirectly through a reflection high energy electron diffraction (RHEED) analysis, in which an electron beam is diffracted off the substrate in the presence of a phosphorous flux, and a pattern produced by the diffracted beam is monitored. The substrate temperature is ramped up by an electric heater, positioned to the rear of the substrate, until a characteristic diffracted beam pattern known as the 2×4 reconstruction pattern is observed. Although the substrate temperature at which this pattern occurs will generally not be known precisely, it normally occurs at about 540° C. for InP. The 2×4 reconstruction temperature then serves as a reference for the MBE growth. The RHEED analysis technique is described in R. Averbeck et al. "Oxide desorption from InP under stabilizing pressures of $P_2$ or $As_4$", *Appl. Phys. Lett.* 59(14) 30 Sep. 1991, pages 1732–1734 and in E. Bauer, "Reflection Electron Diffraction", Chapter 15, pages 501–542, *Techniques for the Direct Observation of Structure and Imperfections Part II*, Interscience Publishers, 1969.

Most of the MBE grown layers of a device such as a HEMT are typically grown at 20° C. below the 2×4 reconstruction temperature, or generally at about 520° C. However, the AlInAs Schottky layer is generally grown at a temperature about 40° C. lower, or about 480° C. This is because a relatively high aluminum content (typically about 0.6) is employed to increase the Schottky layer's breakdown voltage, but the high aluminum content also produces a lattice mismatch between the Schottky layer and the InP substrate. The lower growth temperature for the Schottky layer helps to reduce the strain imposed upon it by the lattice mismatch to avoid formation of dislocation, and thus prevents cracking or other damage to the Schottky layer. However, even with a relatively high aluminum content, the Schottky layer's breakdown voltage is still limited as discussed above. With a lower aluminum content of 0.48, an MBE growth temperature of 530° C. was found to be optimum for a device quality HEMT with an AlInAs buffer layer; Georgakilas et al., "A Comprehensive Optimization of InAlAs Molecular Beam Epitaxy for InGaAs/InAlAs HEMT Technology", *Journal of the Electrochemical Society*, Vol. 140, No. 5, May 1993, pages 1503–1509.

AlInAs Schottky layers have also been grown for HEMTs at a considerably lower temperature region, typically about 150°–200° C. below the 2×4 reconstruction temperature. See U.S. Pat. No. 5,084,743 to Mishra et al. The purpose is to obtain a higher resistivity when a pseudo-insulating Schottky layer is desired. However, growth at these lower temperatures results in an even lower breakdown voltage for the Schottky layer.

SUMMARY OF THE INVENTION

The invention seeks to provide a novel method of growing an AlInAs layer in a device on an InP substrate, with a substantially higher breakdown voltage than has previously been achievable.

This goal is accomplished by growing the AlInAs layer by MBE at a lower than normal substrate temperature of approximately 70°–125° C., and preferably about 80° C., below the temperature at which a 2×4 reconstruction pattern is observed. Contrary to the results obtained when the growth temperature is lowered to 150°–200° C. below the 2×4 reconstruction temperature, MBE growth in the 70°–125° C. intermediate region results in a significant increase in the breakdown voltage level.

For a 2×4 reconstruction temperature of about 540° C., the AlInAs growth temperature range is about 415°–470° C., with a preferred temperature of about 460° C. The growth layer has the composition $Al_xIn_{1-x}As$, in which x is preferably at least about 0.4, with breakdown voltages more than 3 times the highest previously reported with x=0.6.

The invention is applicable to numerous devices, including HEMTs, heterojunction bipolar transistors (HBTs), power switches and thyristors on InP. When used for a power HEMT, the improvement in breakdown voltage significantly increases the output power and power-added efficiency, reduces the gate leakage under operating conditions, and improves the device reliability.

These and other features and advantages of the invention will be apparent to those skilled in the art from the following detailed description, taken together with the accompanying drawings.

BRIEF DESCRIPTION OF THE DRAWINGS

FIG. 1 is an illustrative drawing of an MBE chamber used to practice the invention;

FIG. 2 is a compositional sectional view, not to scale, of an HEMT fabricated in accordance with the invention;

FIGS. 6 and 7 are compositional sectional views showing two embodiments of heterojunction bipolar transistors fabricated in accordance with the invention.

DETAILED DESCRIPTION OF THE INVENTION

Figure 3:
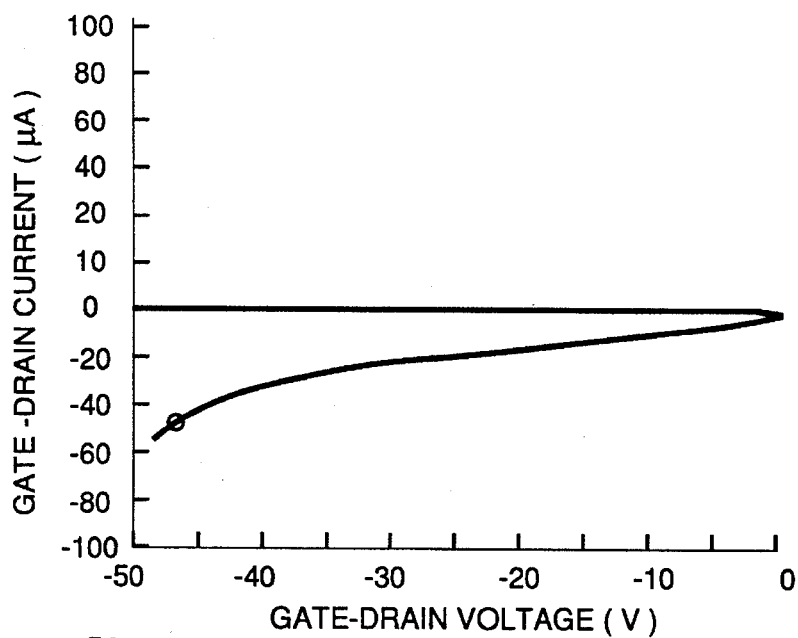
FIG. 3 is a graph of the gate-drain current, as a function of gate-drain voltage, for an HEMT fabricated with the invention.

Significant increases in the breakdown voltage of AlInAs layers in InP-based devices, such as the gate-drain breakdown voltage in an InP-based HEMT, have been obtained by growing the AlInAs layer by MBE at a previously unused intermediate temperature range. Optimum growth temperatures have been found to lie between the conventional temperature of about 60° C. below the 2×4 reconstruction temperature, and the low temperature regime employed for high resistivity layers. While reducing the growth temperature to the low temperature regime of 150° C. or more below the 2×4 reconstruction temperature tends to degrade the breakdown voltage level, reducing the growth temperature by a lesser amount of about 70°–125° C. below the 2×4 reconstruction temperature actually increases the breakdown voltage. The new breakdown voltage level is significantly higher than that achieved at growth temperatures both above and below the new intermediate range. With a typical 2×4 reconstruction temperature of about 540° C., the AlInAs layer is grown at a temperature in the range of about 400°–470° C.

An MBE chamber 2 that can be used to practice the invention is illustrated in FIG. 1. The interior of the chamber is maintained at an ultrahigh vacuum. Indium and aluminum are evaporated from heated crucibles 4 and 6, with the resultant atomic or molecular beams coming together at the site of a heated InP substrate 8 that is supported by a holder 10. Mechanical shutters 4a and 6a are used to interrupt the beams as necessary to produce variations in doping and compositional growth. An electric heater 12 positioned on the opposite side of the substrate from the growth materials controls the substrate temperature.

In the growth of the devices described herein, a cracker arsenic source 14 was employed, rather than the solid As effusion source normally used for MBE growth. The arsenic source flux was created by flowing arsine gas through an EPI GS-TA tantalum gas cracker 16 held at 850° C.; excess hydrogen gas created by the cracking process was removed using a cryopump. The gas enters the chamber through a tube 17. The arsenic flux is controlled by a valve 17a in the arsine gas flow and by using a mass flow controller. During the InP oxide removal stage of the HEMT growth process, in which a phosphorous flux is used instead of arsenic, phosphine gas is substituted for arsine.

To control the initial substrate temperature and InP growth a RHEED screen 18 is positioned inside the MBE chamber 2, in the path of an electron beam 20 that is reflected off the InP substrate 8 to form the RHEED pattern on a phosphorus coated screen. A reference temperature for the growth process is established by gradually heating the substrate in the presence of a phosphorous flux (using a 5 sccm phosphine flow rate) until a 2×4 reconstruction pattern is observed by the RHEED monitor 18. The temperature at which the subsequent device growth takes place is then established by backing off the substrate temperature by predetermined amounts from the reference 2×4 reconstruction temperature using a thermocouple.

FIG. 2 shows the composition of an example of an HEMT 22 that was grown in accordance with the invention. The structure was grown in a Varian Gen II MBE system modified for gas source MBE. Beginning with an InP substrate 24, a 2,5000 Angstrom thick buffer layer 26 of $Al_{0.48}In_{0.52}As$ is surmounted by a 3-layer channel 28. The channel consists of a lower 100 Angstrom doped InP layer 30, an intermediate 50 Angstrom undoped InP layer 32, and an upper 100 Angstrom $Ga_{0.47}In_{0.53}As$ layer 34.

A thin 15 Angstrom $Al_{0.48}In_{0.52}As$ spacer layer 36 is formed on top of the channel, followed by a 50 Angstrom layer 38 of the same spacer material but doped with silicon. The $Al_{0.48}In_{0.52}As$ layer 38 is lattice matched with InP, and is therefore not strained. However, the doped layer 38 has a relatively low breakdown voltage level.

The high breakdown characteristic provided by the invention is implemented with a Schottky layer 40, preferably about 250 Angstroms thick, formed over the silicon doped layer 38. The Schottky layer 40 preferably comprises $Al_{0.6}In_{0.4}As$. The higher proportion of aluminum gives the Schottky layer a higher breakdown voltage than the doped layer 38. Although the higher aluminum content also produces a lattice mismatch with the InP substrate that causes the Schottky layer to be strained, this is not a detriment because the Schottky layer is undoped. Finally, a $Ga_{0.47}In_{0.53}As$ 70 Angstrom cap 42 is grown over the Schottky layer, with an etched opening 44 through which a gate contact 46 to the Schottky layer is made, and source and drain contacts 48 and 50 formed over the cap 42 on opposite sides of the gate contact. All MBE growth is performed at a growth rate of about 1 micron per hour.

Most of the electric field imposed from the gate is dropped across the Schottky layer 40, and the ability of the Schottky layer to withstand this field is a limiting characteristic of the device. The invention significantly increases the Schottky layer's breakdown voltage capability by growing this layer within the intermediate temperature range described above. In a particular set of devices, the substrate temperature was initially elevated under a phosphorous flux (using a 5 sccm phosphine flow rate) to remove the typical oxide layer from the semi-insulating InP substrate. The temperature was elevated until a 2×4 reconstruction pattern was observed by RHEED analysis; the substrate was held at this temperature for two minutes, and then lowered to the growth temperature. All of the device layers were grown at the same temperature except for the Schottky layer, which was grown at a temperature 40° C. lower than the other layers. The GaInAs and AlInAs layers were grown using arsine flow rates of 5 sccm and 3 sccm, respectively, while the InP layers were grown using a phosphine flow rate of 5 sccm. The group V flux switching between arsenic and phosphorous was accomplished by first stopping the Group III element(s), pausing for three seconds, switching to the other Group V flux, pausing for seven seconds, and then restarting the Group III element(s).

In one demonstration, five wafers were grown at 20°, 40°, 60°, 80° and 150° C. below the 2×4 reconstruction temperature, with the Schottky layer grown at a 40° lower temperature in each case. FIG. 3 shows the relationship between the gate-drain current and the gate-drain voltage for a device that had a 0.25 micrometer gate length and a 5 micrometer drain-to-source spacing, was fabricated on the wafer at 40° C. below the 2×4 reconstruction temperature (80° C. below for the Schottky layer), and was operated at a 600 mA/mm current density. The gate-to-drain breakdown voltage is defined as the voltage at which a gate-drain current density of 1 mA/mm is observed. This occurred at 47 volts, a much higher level than the previous best breakdown voltage of about 10 volts. When the current density was lowered to 400 ma/mm, the gate-to-drain breakdown voltage improved to 59 volts.

Figure 4:
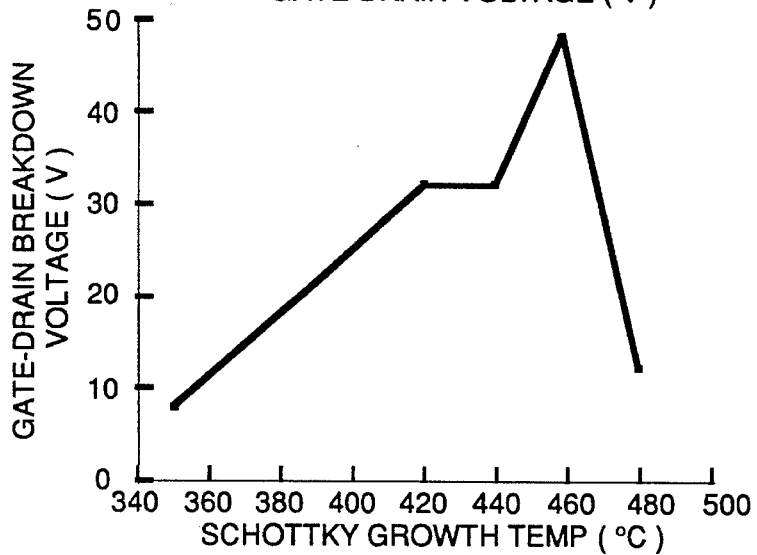
FIG. 4 is a graph of gate-drain breakdown voltages achieved with AlInAs Schottky layer growths at different temperatures.

FIG. 4 illustrates the variation in gate-to-drain breakdown voltage as a function of the growth temperature for the various wafers. The highest breakdown voltage was obtained with devices fabricated at 40° C. below the 2×4 reconstruction temperature, with the Schottky layer grown at about 80° C. below the 2×4 reconstruction temperature. For a 2×4 reconstruction temperature of 540°, these growth temperatures correspond to 500° C. and 460° C., respectively. In addition, when the devices are pinched-off they exhibit drain-to-source breakdown voltages in the 20–30 volt range. This compares favorably with the prior best drain-source breakdown voltages of less than 10 volts, and allows for operating biases up to 10 volts without excessive gate leakage.

When the Schottky layer growth temperature was raised from 460° C. to 480° C., a more conventional growth temperature, a drastic reduction in the gate-drain breakdown voltage from 47 to 13 volts was observed. At somewhat lower Schottky growth temperatures of 420° and 440° C., the gate-drain breakdown voltage was at an intermediate level of 33 volts. When the Schottky growth temperature was reduced down to 350° C., putting it in the low temperature growth range previously employed for high resistivity layers, the breakdown voltage was reduced to 8 volts.

Figure 5:
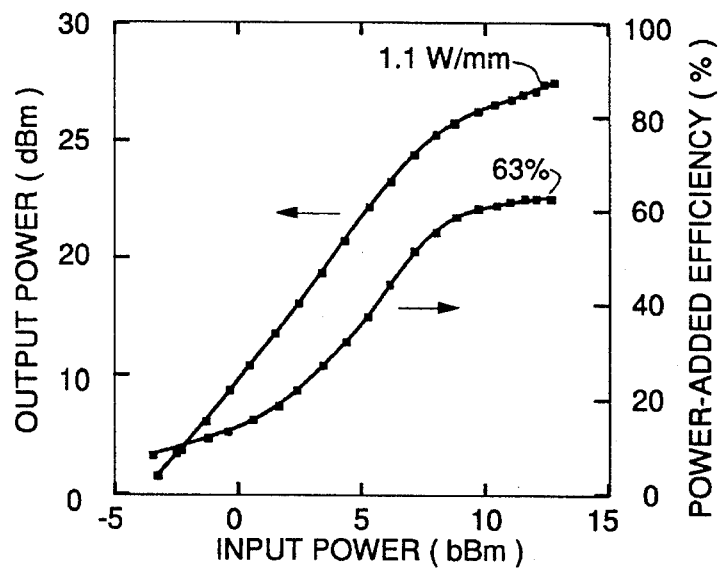
FIG. 5 is graph of output power and power-added efficiency, as a function of input power, for an HEMT fabricated with the invention.

One of the advantages of the invention is that the high breakdown voltage is achieved without any degradation of other device parameters. The HEMTs had full channel current densities of more than 500 mA/mm, and peak transconductances of approximately 600 mS/mm. The combination of high breakdown voltage, current density and transconductance is believed to be the best result ever measured on any type of field effect transistor (FET). As illustrated in FIG. 5, with an input power of about 12.6 dBm, an output power of 27.5 dBm (560 mW) was achieved with a 500 micrometer wide HEMT (corresponding to a power density of 1.1 W/mm), with a power-added efficiency of 63% at 4 GHz. (Power-added efficiency is defined as the difference between the output and input power levels, divided by the DC power dissipated in the device).

While the higher 0.6/0.4 Al/In ratio contributed to the higher breakdown voltage, the majority of the breakdown voltage improvement can be attributed to the new growth temperature. Higher breakdown voltages are also achieved with lower Al/In ratios such as 0.48/0.52 when growth is performed in the new temperature range, compared to similar devices grown at more conventional temperatures. In general, breakdown voltages are improved for Al/In ratios on the order of 0.4/0.6 or greater. The breakdown voltage may also be improved with lower proportions of Al, but this has not been demonstrated.

The invention is also applicable to other InP-based devices that require a high voltage breakdown layer. Examples are in the collector of a heterojunction bipolar transistor (HBT), in the diode base-collector junction of a power switch, and at the p-n junction in a thyristor.

One example of an HBT that uses the invention is shown in FIG. 6. The structure is known, except previously an InP layer about 500–750 nm thick with an n-type dopant concentration of about $1.4-3\times10^{16}$ cm$^{-3}$ was used for the collector. In the new HBT structure, a low temperature grown AlInAs layer is substituted for the prior InP collector. The new AlInAs collector can be grown on the order of 250 nm thick, and can have the same dopant concentration range as the prior InP collector.

Working up from an InP substrate 52, the illustrative HBT consists of the following layers:

Undoped 10 nm GaInAs buffer 54;
$1\times10^{19}$ cm$^{-3}$ n-doped 700 nm GaInAs subcollector 56;
The AlInAs collector 58 described above;
$1.4-3\times10^{16}$ cm$^{-3}$ n-doped 100 nm GaInAs/InP compositional grade 60;
$1\times10^{17}$ cm$^{-3}$ n-doped 20–50 nm GaInAs spacer 62;
$5\times10^{17}$ cm$^{-3}$ p-doped 20 nm GaInAs spacer 64;
$2\times10^{19}$ cm$^{-3}$ p-doped 60 nm GaInAs base 66;
$2\times10^{18}$ cm$^{-3}$ p-doped 10 nm GaInAs spacer 68;
$8\times10^{17}$ cm$^{-3}$ n-doped 30 nm AlInAs/GaInAs compositional grade 70;
$8\times10^{17}$ cm$^{-3}$ n-doped 120 nm AlInAs emitter 72;
$1\times10^{19}$ cm$^{-3}$ n-doped 70 nm AlInAs emitter contact 74;
$1\times10^{19}$ cm$^{-3}$ n-doped 100 nm GaInAs contact 76.

An alternate HBT embodiment is shown in FIG. 7. It has a structure similar to the FIG. 6 device, except that the InP collector layer 78 is retained, with the high breakdown voltage AlInAs layer 58 grown immediately on top of it. In both HBT structures the AlInAs layer 58 is preferably grown about 40° C. below the temperature at which the remainder of the device is grown, as described above in connection with the exemplary HEMT.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A method of growing a device on an InP substrate with a high voltage breakdown layer of AlInAs, comprising:

growing said AlInAs layer by molecular beam epitaxy (MBE) at a temperature that is greater than 450° C. but less than 470° C., growing remaining portions of said device by MBE at a substantially higher temperature than said AlInAs layer growth temperature, said substantially higher temperature being below the 2×4 reconstruction temperature for said substrate by more than 20° C., and selecting said AlInAs layer growth temperature so that said AlInAs layer has a higher breakdown voltage than if it were grown at either said substantially higher temperature or at a temperature less than 450° C.

2. The method of claim 1, wherein said AlInAs layer is grown at a temperature of about 460° C.

3. The method of claim 1, wherein said AlInAs layer has a composition $Al_xIn_{1-x}As$, with X at least about 0.4 but less than 1.0.

4. The method of claim 1, wherein said AlInAs layer growth is performed with a gaseous As source and solid Al and In sources.

5. The method of claim 1, wherein said device includes intermediate layers of material grown by MBE at said substantially higher temperature between said AlInAs layer and said InP substrate.

6. The method of claim 5, wherein said AlInAs layer comprises a gate layer of a high electron mobility transistor (HEMT).

7. The method of claim 1, wherein said AlInAs layer comprises a collector layer of a heterojunction bipolar transistor.

8. The method of claim 1, wherein said AlInAs layer is grown on an InP collector layer in a heterojunction bipolar transistor.

9. The method of claim 1, wherein said AlInAs layer is grown on an InP collector layer in a heterojunction bipolar transistor.

10. The method of claim 1, wherein said remaining portions of said device are grown by MBE at a temperature 40° C. higher than said AlInAs layer growth temperature.

11. The method of claim 1, wherein said substantially higher temperature is on the order of 40° C. below the 2×4 reconstruction temperature for said substrate.

12. A method of growing a device on an InP substrate with a high voltage breakdown layer of AlInAs, comprising:

placing the substrate in a molecular beam epitaxy (MBE) chamber, performing reflective high energy electron diffraction (RHEED) analysis of said substrate to obtain a diffracted electron beam pattern, monitoring said diffracted electron beam pattern, progressively increasing the substrate temperature until a 2×4 reconstruction pattern is indicated by said monitored diffracted electron beam pattern, lowering the substrate temperature by more than 70° C. but less than 90° C. from the temperature at which said 2×4 reconstruction pattern was obtained, growing said AlInAs layer by MBE within said chamber at said lowered temperature, growing remaining portions of said device by MBE at a substantially higher temperature than said AlInAs layer growth temperature, said substantially higher temperature being below the 2×4 reconstruction temperature for said substrate by more than 20° C., and selecting said AlInAs Layer growth temperature so that said AlInAs layer has a higher breakdown voltage than if it were grown at either said substantially higher temperature or at a temperature that is below said 2×4 reconstruction temperature by more than 90° C.

13. The method of claim 12, wherein said AlInAs layer is grown at a temperature about 80° C. below the temperature at which said 2×4 reconstruction pattern was obtained.

14. The method of claim 12, wherein said AlInAs layer has a composition $Al_xIn_{1-x}As$, with X equal to at least about 0.4 but less than 1.0.

15. The method of claim 12, wherein said AlInAs layer. MBE growth is performed with a gaseous As source and solid Al and In sources.

16. The method of claim 12, wherein said device includes intermediate layers of material grown by MBE at said substantially higher temperature between said AlInAs layer and said InP substrate.

17. The method of claim 16, wherein said AlInAs layer comprises a gate layer of a high electron mobility transistor (HEMT).

18. The method of claim 12, wherein said AlInAs layer comprises a collector layer of a heterojunction bipolar transistor.

19. The method of claim 12, wherein said remaining portions of said device are grown by MBE at a temperature 40° C. higher than said AlInAs layer growth temperature.

20. The method of claim 12, wherein said substantially higher temperature is on the order of 40° C. below said 2×4 reconstruction temperature for said substrate.

* * * * *